United States Patent
Boutros

[11] Patent Number: 5,872,492
[45] Date of Patent: *Feb. 16, 1999

[54] CIRCUIT BOARDLESS COMMON MODE FILTER AND TRANSFORMER CONNECTOR

[75] Inventor: Kamal Shawiky Boutros, Richmond Hill, Canada

[73] Assignee: Amphenol Corporation, Wallingford, Conn.

[*] Notice: This patent issued on a continued prosecution application filed under 37 CFR 1.53(d), and is subject to the twenty year patent term provisions of 35 U.S.C. 154(a)(2).

[21] Appl. No.: 657,209

[22] Filed: Jun. 3, 1996

[51] Int. Cl.$^6$ .................................................. H03H 7/09
[52] U.S. Cl. ........................... 333/182; 333/185; 439/620
[58] Field of Search ................................... 333/177, 182, 333/185, 181; 439/620

[56] References Cited

U.S. PATENT DOCUMENTS

| | | | |
|---|---|---|---|
| 4,772,224 | 9/1988 | Talend | 439/620 X |
| 4,795,991 | 1/1989 | Saito et al. | 333/181 |
| 5,015,204 | 5/1991 | Sakamoto et al. | 439/620 |
| 5,069,641 | 12/1991 | Sakamoto et al. | 439/620 |
| 5,132,655 | 7/1992 | Suzuki et al. | 336/192 |
| 5,139,442 | 8/1992 | Sakamoto et al. | 439/620 |
| 5,282,759 | 2/1994 | Sakamoto et al. | 439/620 |
| 5,397,250 | 3/1995 | Briones | 439/620 |
| 5,587,884 | 12/1996 | Raman | 439/620 X |
| 5,687,233 | 11/1997 | Loudermilk et al. | 333/185 X |
| 5,736,910 | 4/1998 | Townsend et al. | 333/181 |

OTHER PUBLICATIONS

Matsch, *Electromagnectic and Electromechanical Machnies*, Harper & Row, New York, NY, p. 100. 1977.

*Primary Examiner*—Robert Pascal
*Assistant Examiner*—Justin P. Bettendorf
*Attorney, Agent, or Firm*—Bacon & Thomas, PLLC

[57] ABSTRACT

A common mode filter with a choke portion and an electrical isolation portion is made up of two core members, each core member having two legs. A first winding is wrapped around the first leg of the first core member to form a first coil of the isolation section, but the secondary coil of the isolation section and both coils of the choke section are formed by a single winding which may be a single wire or may include a portion connected through a circuit board. The ends of the second winding may be shaped so as to form the mating sections of a pair of RJ contacts, while the ends of the first winding may be shaped to form pins for insertion into openings in a LAN interface card, the core structures being positioned in a rear chamber of an RJ connector.

6 Claims, 5 Drawing Sheets

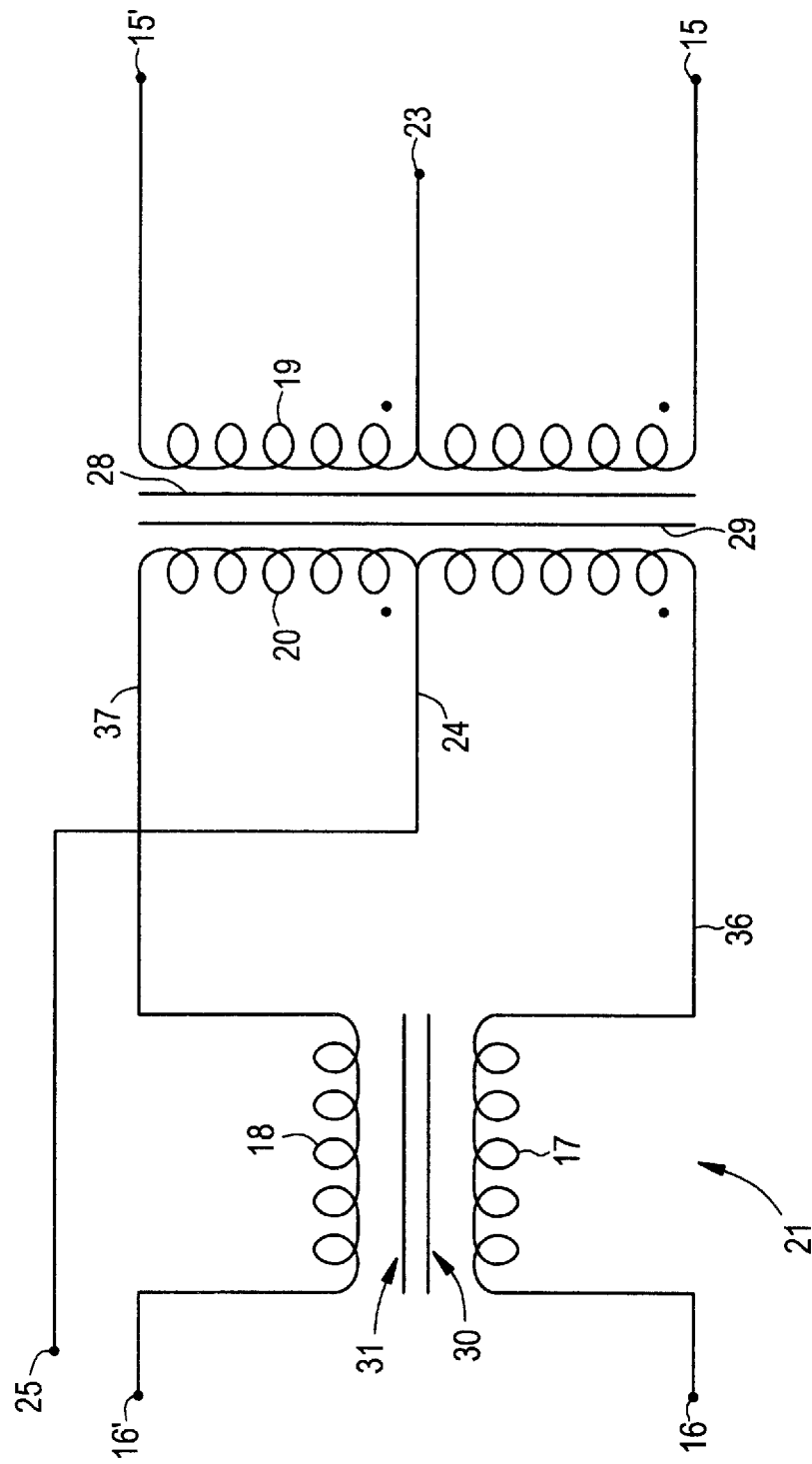

CIRCUIT BOARDLESS COMMON MODE FILTER AND TRANSFORMER CONNECTOR

BACKGROUND OF THE INVENTION

1. Field of the Invention

This invention relates to the combination of an isolation circuit and a common mode filter circuit which may be used, by way of example, to connect a computer to a local area network (LAN), and to an electrical connector which includes such a combined isolation and common mode filter circuit.

2. Description of Related Art

Electrical connectors known as modular phone receptacles or jacks have been known for many years. Although connectors of this type were originally designed for use in telephone systems, they have found wide acceptance in a variety of other contexts. For example, modular jacks are now commonly used as input/output (I/O) interface connectors for enabling computers to communicate with each other and with a variety of peripheral equipment, and in particular as connectors between a local area network (LAN) and an appropriately configured interface card.

In order to receive a corresponding modular plug, the conventional modular jack is generally made up of a socket housing which includes a plug-receiving opening, opposed top and bottom surfaces joined by opposed side surfaces extending from the opening to a back surface, and a plurality of stamped, metallic elongated contacts mounted in the housing for engaging contacts of the corresponding plug. Each contact in this type of connector includes a contact mating portion at one end extending diagonally into the socket, a vertically extending lead portion at the other end, and a horizontally extending intermediate portion between the contact mating portion and the lead portion. Generally, the lead portions of the contacts are inserted directly into openings in the interface card and soldered in place.

Because the above-described type of modular jack is often used for digital communications, the devices in which this type of connector is used have a tendency to emit high frequency radiation which can interfere with other electrical equipment. In addition, the devices are themselves vulnerable to noise or transients induced in an incoming line by external sources. While adding filtering circuitry to the interface card can often be used to solve such problems, the difficulty at designing circuitry which meets current emissions requirements as well as space considerations suggests that inclusion of filtering or transient suppression capabilities in the connector would be desirable under certain circumstances, and in particular where the cost of providing on-board filtering exceeds the cost of adding filters to the connector.

In general, prior attempts to add common mode filtering to interface connectors for LANs and similar applications have fallen into one of three categories:

1.) connectors in which the filter components are provided on a miniature circuit board fitted into or onto the connector, as described in U.S. Pat. No. 5,069,641 (Sakamoto et al.), or on circuit board traces applied directly to the connector, as described in U.S. Pat. No. 5,282,759 (Sakamoto et al.);

2.) connectors in which the connector contacts are inserted through central openings in a ferrite block which forms the inductive component of the common mode filter, as described in U.S. Pat. Nos. 4,772,224 (Briones) and 5,397,250 (Talend); and 3.) connectors in which the contacts are wrapped around the filter components, as described in U.S. Pat. Nos. 5,015,204 (Sakamoto et al.) and 5,139,442 (Sakamoto et al.).

Filters of the first type, in which the circuitry is provided on a printed circuit board, have the disadvantage that they are relative expensive in comparison with corresponding circuitry mounted on a host interface card or circuit board, due to the limited space available within the standard connector and the consequent need for miniaturization. Filters of the second and third types, on the other hand, are simpler to install and use less expensive bulk components, but have the disadvantage of failing to offer electrical isolation between input and output circuits, as a result of which the isolation circuitry must still be provided on the host circuit card.

FIGS. 1A–1C show a typical example of the third type of prior art filtering arrangement mentioned above, in which the common mode filter is formed by wrapping the connector contacts around a ferrite core, as disclosed in U.S. Pat. No. 5,015,204. The prior arrangement provides an inductive core 1, which is positioned at the rear of an RJ connector, and contacts that extend from a first end, the first end being in the form of a front mating interface portion 2 arranged to engage corresponding portions of the contacts of an RJ connector plug, to a second end which forms PCB tails 3 for insertion into openings in a printed circuit board 6. In order to form the common mode filter, the electrical schematic for which is illustrated in FIG. 1A, the contacts are wrapped around legs 4 of the inductive coil 1 to form coils 5.

In order to accommodate the filter, the conventional arrangement requires modification of the connector by constructing the connector of a lid member 8 and a base member 7 having an extension 9 which separates the interior of the connector into a plug receiving chamber 10 and a filter accommodating chamber 11. The filter is positioned in the chamber 11 by a cavity 12 provided in the base member 7, and held in place by a pressure bar spring 13 itself positioned in a positioning member 14 depending from the lid member 8 or upper half of the connector housing.

As indicated above, the disadvantage of this arrangement is that it does not/cannot accommodate both the common mode filter and isolation circuitry, and thus it has conventionally been necessary to include a transformer on the interface card, or eliminate bulk components in favor of circuit traces at the rear of the connector and a prepackaged miniature transformer of the type described, for example, in U.S. Pat. No. 5,403,207.

As will be discussed in more detail below, the present invention modifies the concept exemplified by the arrangement illustrated in FIGS. 1A–1C by including within the connector both a common mode filter and an isolating transformer, while using easily assembled bulk components.

This is basically accomplished by separating the front portion of the RJ contact structure from the portion which extends from the connector and is inserted into the host circuit board or interface card, and by utilizing a unique core and winding structure that enables assembly of the filter and transformer structures in an especially efficient manner. As a result of this structure, all of the circuitry shown in FIG. 2 can be placed within a connector rather than on the circuit board.

SUMMARY OF THE INVENTION

It is accordingly an objective of the invention to overcome the disadvantages of prior common mode filters by providing a common mode filter which is simple in structure and easily assembled to an electrical connector.

It is a further objective of the invention to provide an electrical connector having a common mode filter which is simple in structure, provides electrical isolation, and easily assembled.

It is yet another objective of the invention to provide an RJ connector having a common mode filter which is simple in structure, provides electrical isolation, and in which the filter is easily assembled to the connector.

These objective of the invention are achieved by providing a common mode filter in the form of a pair of pi-shaped core members made of a material having magnetic properties which are assembled together to form, together with cap or cover members, the core of an inductor, and in which the inductor windings are formed not by wrapping individual contacts around respective legs of the core, but rather are partially formed by wrapping the connector contacts around the legs of one of the cores to form the common mode filter and by then wrapping the contacts around one of the legs of the second core to form a first winding of an isolation transformer, the second winding of the isolation transformer being provided by a discrete contact member which forms the connector's printed circuit board tails, or by wrapping the connector contacts around both legs of one of the connector cores to form the common mode filter, and connecting the common mode filter with a discrete winding of the isolation transformer via the circuit board, the other winding of the isolation transformer being provided by a discrete contact member which forms the connector's printed circuit board tails.

This arrangement is particularly advantageous relative to an arrangement of the type described in U.S. Pat. No. 5,015,204, because the filter of the invention provides isolation between the plug and board-side contacts, whereas the arrangement of the previous connector provided a continuous path around the inductor with no isolation. While prior common mode filters existed which provided isolation, such as the one in U.S. Pat. No. 5,282,759, the isolation was achieved at the cost of greatly increased complexity.

In each of the preferred embodiments of the invention, the connectors may be in the form of an RJ connector, for example a high speed RJ-45 connector of the type typically used on network or communications interface cards, although the principles of the invention could possibly be used in a variety of applications requiring a simplified structure for implementing a circuit of the type illustrated in FIG. 2.

BRIEF DESCRIPTION OF THE DRAWINGS

FIG. 2 is a schematic circuit diagram of a common mode filter and isolation transformer arrangement constructed in accordance with the principles of a preferred embodiment of the invention.

DETAILED DESCRIPTION OF THE PREFERRED EMBODIMENT

Figure 1A:
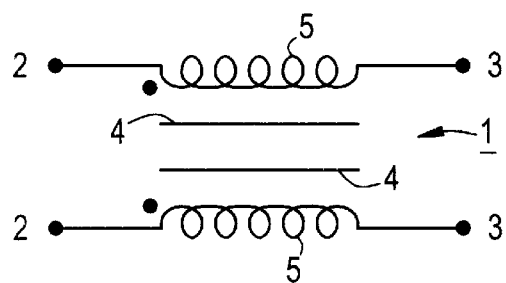
FIG. 1A is a schematic circuit diagram showing a conventional common mode filter.
Figure 1B:
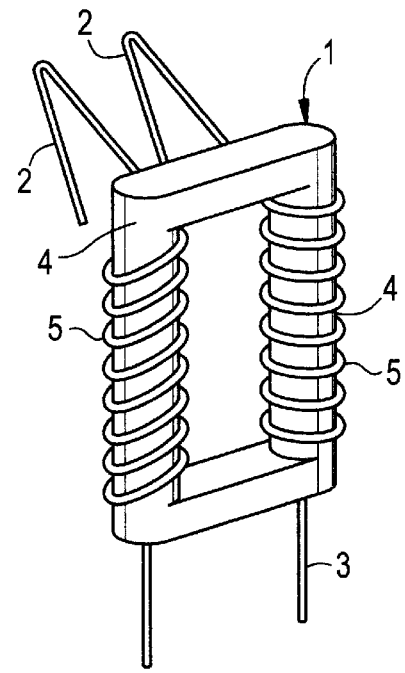
FIG. 1B is a perspective view of a conventional implementation of the common mode filter of FIG. 1A.
Figure 1C:
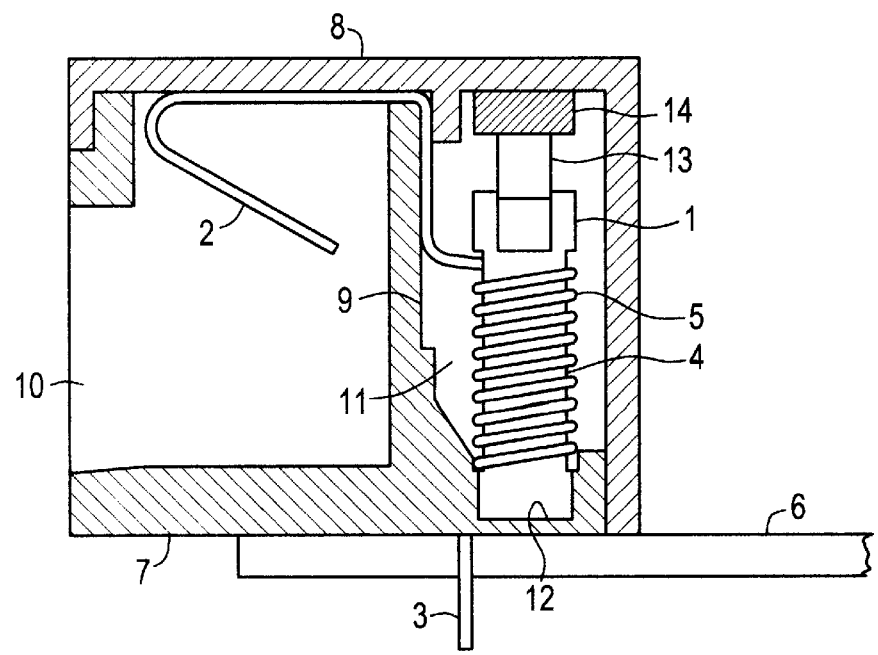
FIG. 1C is cross-sectional side view of an RJ-type connector plug including the conventional common mode filter illustrated in FIG. 1B.

In the schematic circuit diagram of FIG. 2, the terminals indicated by reference numerals 16 and 16' correspond to the mating ends of the conventional RJ contacts 2 illustrated in FIG. 1C, and the terminals indicated by reference numerals 15 and 15' correspond to the downwardly extending portions 3 of the conventional RJ contacts illustrated in FIG. 1C. It will be appreciated by those skilled in the art, however, that the principles of the invention may be applied to contacts other than "RJ" contacts, e.g., contacts in which the mating portion has a configuration other than the acute angle of the RJ contacts illustrated in FIG. 1C, or contacts in which the downwardly extending portions are arranged for surface mounting or for plugging into openings in the circuit board rather than for insertion therein and subsequent soldering in place.

The circuit illustrated in FIG. 2 includes both inductor or choke coils 17, 18 and also isolation coils 19,20. Because isolation coils 19 and 20 are not physically connected to each other, the "wires" on either side of the isolation or transformer coils are discrete structures, and instead of connecting terminals 15 and 15' to respective terminals 16 and 16' as in the prior art, terminals 15 and 15' are connected to each other and terminals 16 and 16' are connected to each other, such that coil 19 and terminals 15 and 15' form a single contact structure and coils 17, 18 and 20 together with terminals 16 form a second contact structure. Terminal 23 illustrated in FIG. 2 is an optional center tap for the primary winding of the isolation transformer, while terminal 24 is an optional center tap for the secondary winding of the isolation transformer.

Although terminals 16 and 16' are described as corresponding to the contacts of an RJ connector, and terminals 15 and 15' are described as PCB tails, with the common mode filter being located between the connector contacts and the transformer, those skilled in the art will note that the filter could also be located between the isolation transformer and the terminals connected to the circuit board, and that the invention in its broadest form should not be limited to any particular terminal structure for either terminals 15 and 15' or terminals 16 and 16'.

Figure 3:
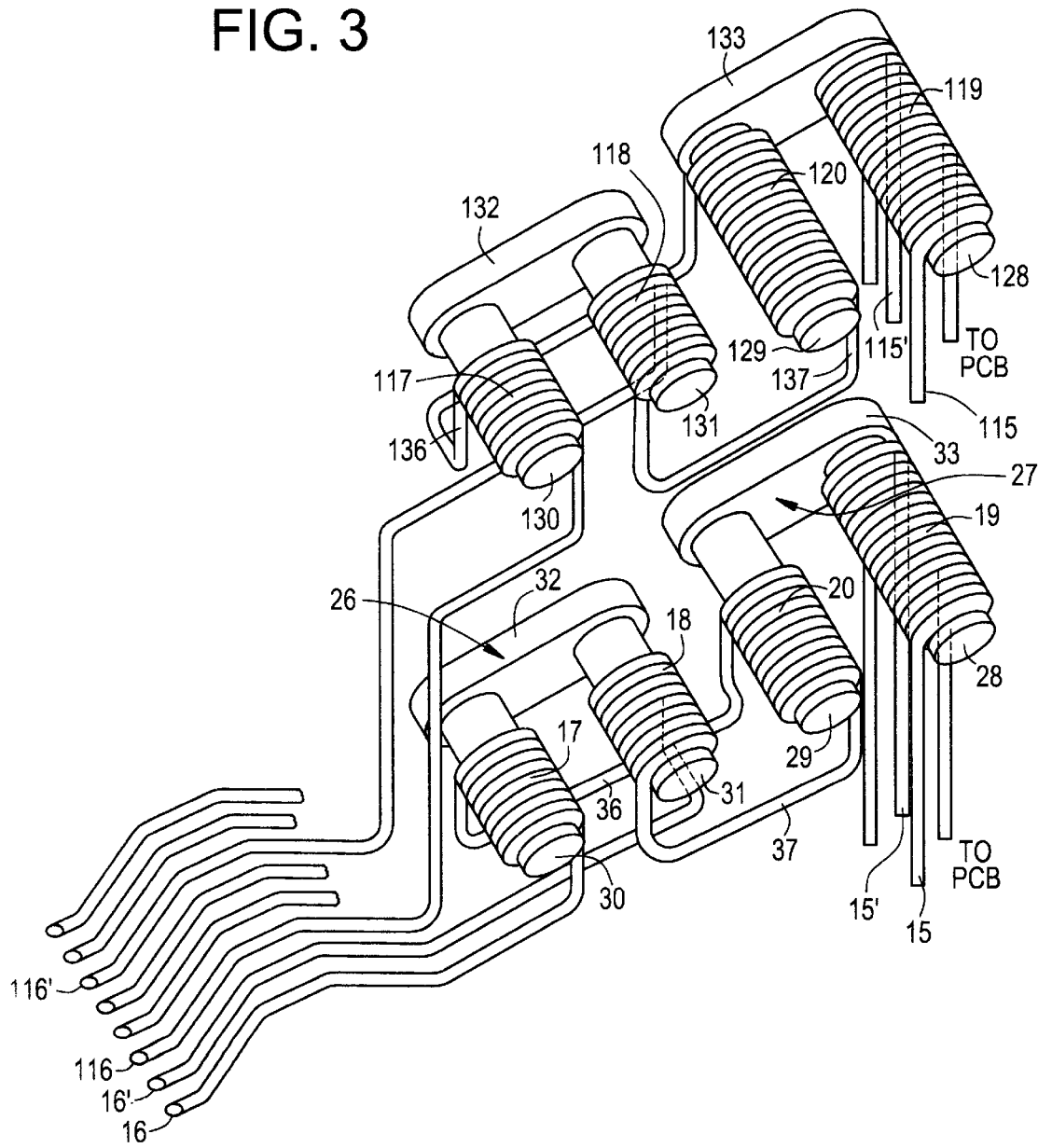
FIG. 3 is a perspective view of an implementation of the common mode filter and isolation transformer arrangement schematically illustrated in FIG. 2, but with no center tap on the primary side of the transformer.

The core structures for the combined common mode filter and isolation transformer of the invention, as best illustrated in FIG. 3, include two closed cores 26 and 27, each made up of two legs 28–31 and two end caps (of which only the first end cap 32,33 of each core is shown). The core legs and end caps are each made up of a magnetic material such as a ferrite material with high magnetic permeability and high electrical resistivity, although the material of the different cores may have different magnetic properties based on their different functions. It will be appreciated by those skilled in the art that the separation of the cores 26 and 27 into legs 28–31 and caps 32, 33 is for convenience in manufacturing the cores and wrapping the respective contacts around them, rather than for any electrical purpose, and that the core structure may be varied from the cylindrical leg/flat end cap structure shown (for example, it may be convenient to form the legs and one of the end caps as a unit, and then to add the second end cap after winding).

In this implementation of the preferred common mode filter, coil 19 is wrapped around core leg 28 to form the first winding of the isolation section of the preferred circuit. The two ends of coil 19 extend downwardly from the coil and are shaped into PCB tails or terminals 15 and 15' for engaging conductive elements on a circuit board (not shown). It will be appreciated, as indicated above, that sections 15 and 15' may have different shapes depending on the requirements of the board or card with which the connector is to be used, and that these terminals may also be shaped to accommodate, for example, insulation displacement contacts or various other contact configurations for connection to a flat cable or other device.

Coils 17, 18, and 20, are preferably formed in this embodiment by a single wire starting at one of the terminals 16, and which is first wrapped around core leg 30 and then wrapped, via a connecting section 36, around core leg 29, via a connecting section 37 around core leg 31, and finally extends to terminal 16' to thereby form the network side of the connector wiring. It will again be appreciated that terminals 16 and 16' may have shapes other than the illustrated RJ contact shapes depending on the the device to which these sections are to be connected or terminated.

In addition to the first filter and transformer structures described above, the arrangement illustrated in FIG. 3 includes a second filter and a second isolation transformer arranged above the first filter and isolation transformer. The winding arrangement for the second filter and isolation transformer is the same as for the first filter and isolation transformer, and thus will not be described in detail herein except to note that reference numerals 15–37 for the first set of components correspond respective to reference numerals 115–137 for the second set of components.

Figure 4:
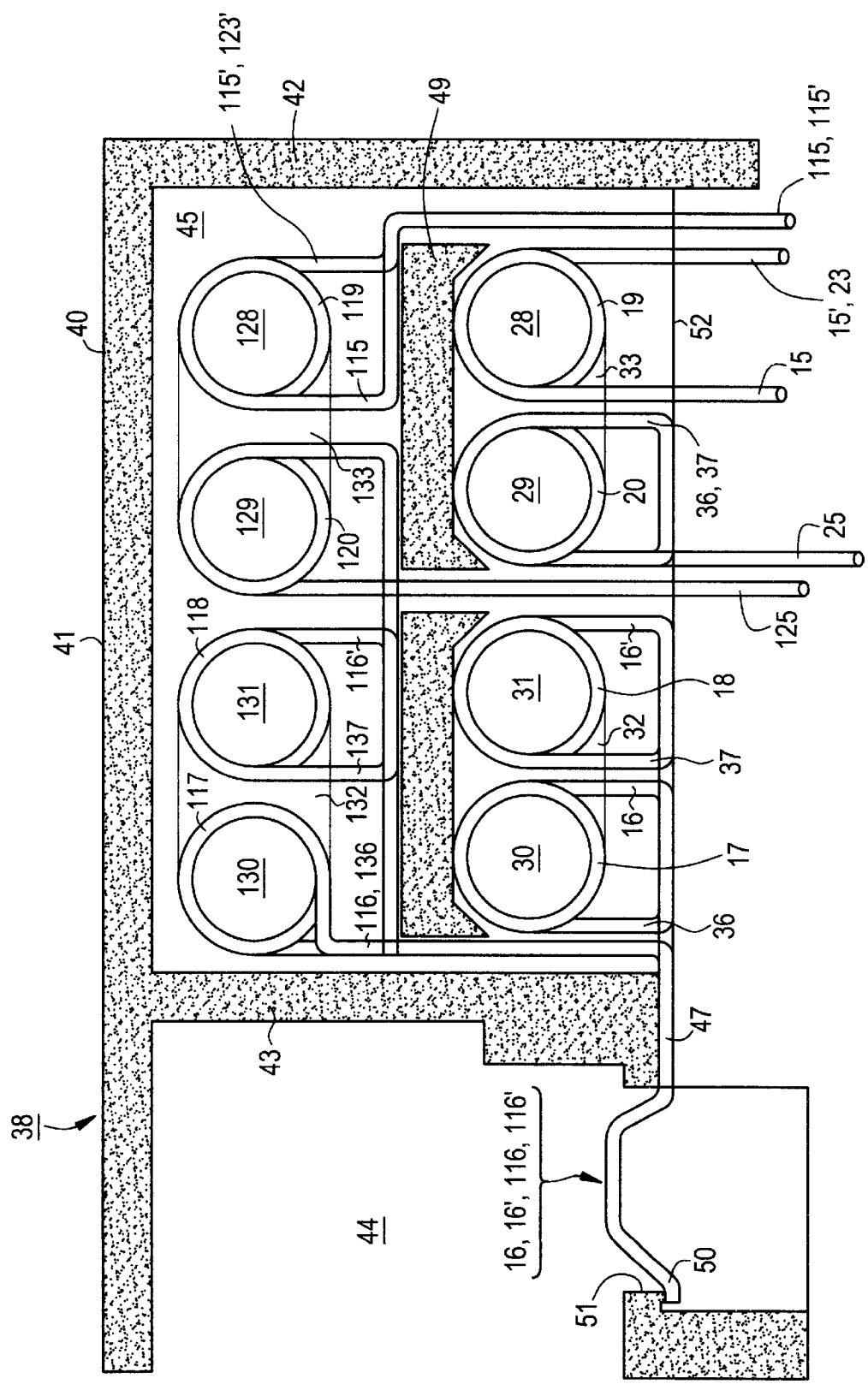
FIG. 4 is a cross-sectional side view of a connector which incorporates the common mode filter implementation illustrated in FIG. 3, and includes a center tap on the primary side of the transformer.

As illustrated in FIG. 4, the preferred common mode filter arrangement may be used in an RJ type connector as follows, although those skilled in the art will appreciate that the illustrated connector is not the only connector to which the principles of the invention may be applied. As is conventional, the connector of this embodiment includes a molded plastic housing 38 which includes a bottom 52, a cover or lid member 40 which forms the top 41, rear 42, and sides (not shown) of the connector, and which includes a downwardly depending wall 43 for dividing the interior of the connector into a front chamber 44 for receiving the mating plug connector and a rear chamber 45 for accommodating the contact. Dividing wall 43 includes grooves, or simply ends a small distance from the bottom side of the connector, to permit passage of a portion 47 or the mating sections 16, 16', and optionally, primary winding center tap 23.

Also shown in FIG. 4 is an optional second common mode filter and isolation transformer arrangement isolated from the first common mode filter and isolation transformer by isolating partition or partitions 49 and corresponding to the second filter and transformer arrangement illustrated in FIG. 3. The structure of the second filter/transformer arrangement is identical to that of the first arrangement, except that the terminating leads 115, 115', as well as optional leads 123 and 125 extend through openings in partition 49 and through the lower portion of rear chamber 45 to reach the circuit board. The parts of the second arrangement corresponding to parts 15–23, 25–28, 36, and 37, have been numbered respectively as elements 115–123, 125–128, 136, and 137.

Those skilled in the art will appreciate that the front-to-rear dimension of the rear chamber 45 may be larger than that of the corresponding chamber in the conventional connector illustrated in FIG. 1C so as to accommodate two cores rather than a single core. In general, at least in interface cards, it is the width and height of the connector that is more limited than the depth, and thus there is some freedom to adjust the dimensions of the connector as necessary. This adjustment in somewhat facilitated in that, in the illustrated connector, the mating contact sections extend from the bottom of the plug receiving chamber 44 rather than the top. In this configuration, the ends 50 of the contacts are positioned against a shoulder or overhang 51 at the front of the connector, with the contact bias obtained by bending the contacts as illustrated being in the upper direction. It will of course also be appreciated by the skilled artisan that the illustrated design could easily be adapted for use with contacts arranged to extend from the top rather than the bottom of the plug receiving chamber.

Figure 5:
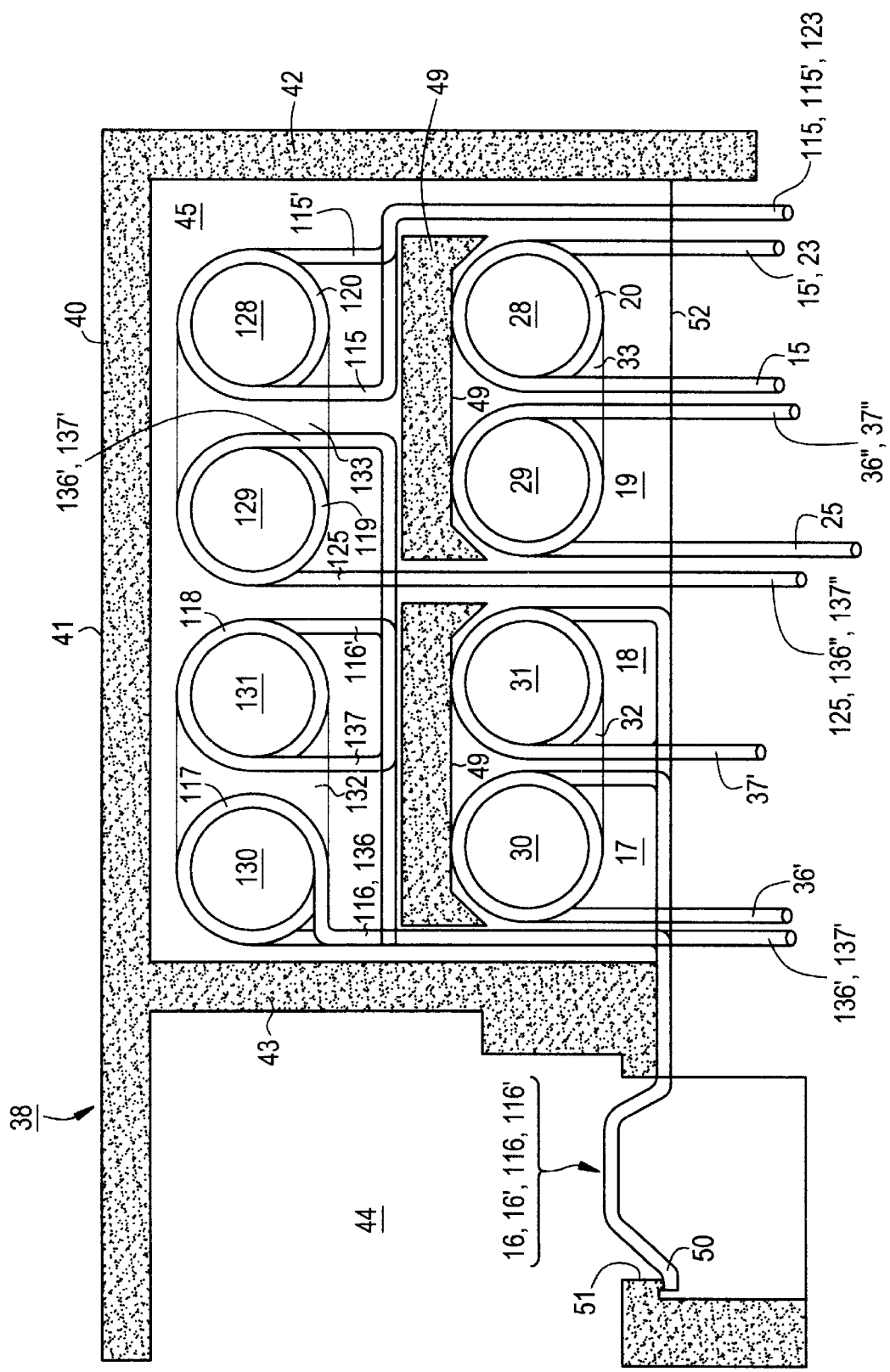
FIG. 5 is a cross-sectional side view of a variation of the common mode filter implementation illustrated in FIG. 4.

In the variation of the preferred embodiment shown in FIG. 5, connecting sections 36,37 and 136,137 depicted in FIG. 4 are replaced by terminals 36',37',136',137' and 36", 37",136",137", extending respectively from coils 17,18,117, 118,19,119 and connected to each other by traces on a circuit board (not shown) to connect the respective filter windings 17,18 and 117,118 to transformer windings 19 and 119. This variation has the advantage of simplifying the construction of the transformer circuitry by separating the front and rear sections so that some of the windings are reduced in length and therefore made easier to manufacture and assemble. In addition, by separating the network side transformer winding from the common mode filter windings, different size or type wires can be used for each winding.

Assembly of the illustrated connector simply involves winding the appropriate core legs, shaping the ends of the contacts as desired, positioning the core structures on a base of the connector such that the terminals extend through openings in the base, and attaching the lid member 40 to capture the filter structure and contacts. While additional core positioning structures may be added as a matter of design choice, for example by using recesses and fixing members in the manner of the illustrated conventional connector, it is noted that no electrical connections need be made when assembling the connector, as would be the case in the types of connector in which the electrical components are in the form of packages having leads which are connected to the contacts.

Having thus described a preferred embodiment of the invention with sufficient particularity to enable those skilled in the art to easily make and use the invention, and having described several possible variations and modifications of the preferred embodiment, it should nevertheless be appreciated that still further variations and modifications of the invention are possible, and that all such variations and modifications should be considered to be within the scope of the invention. For example, in the embodiments of FIGS. 4 and 5, it may be desirable to reduce the total number of ferrite cores, to add an additional common mode choke on the PCB side of the circuit, or to add other additional circuit components. Accordingly, the scope of the invention should not be limited by the above description, but rather should be interpreted solely in accordance with the appended claims.

I claim:

1. An electrical connector, comprising:

an electrical connector housing having an opening arranged to receive a mating connector;

a first core structure including first and second core sections, said said first core structure forming the core of a transformer, said transformer including a primary winding comprising a coil wrapped around the first core section; and a secondary winding comprising a coil wrapped around the second core section;

a second core structure including third and fourth core sections, said second core structure forming a common core for first and second choke coils, the first choke coil comprising a coil wrapped around the third core section and the second choke coil comprising a coil wrapped around the fourth core section, wherein said coils wrapped around the second, third, and fourth core sections are formed by a single wire extending continuously around and between said first and second core structures, thereby eliminating the need for a circuit board internal to the connector housing in order to connect the secondary winding of the transformer to the two choke coils.

2. A connector as claimed in claim 1, wherein ends of the single wire are shaped to form mating sections of a pair of RJ contacts.

3. A connector as claimed in claim 1, wherein ends of the first winding are shaped for electrical connection to a printed circuit board on which the connector housing is mounted.

4. An electrical connector, comprising:

an electrical connector housing having an opening arranged to receive a mating connector;

a first core structure including first and second core sections, said said first core structure forming the core of a transformer, said transformer including a primary winding comprising a coil wrapped around the first core section; and a secondary winding comprising a coil wrapped around the second core section;

a second core structure including third and fourth core sections, said second core structure forming a common core for first and second choke coils, the first choke coil comprising a coil wrapped around the third core section and the second choke coil comprising a coil wrapped around the fourth core section, wherein said connector housing is mounted on a circuit board, ends of said primary winding are electrically connected to circuitry on the circuit board, and the first and second choke coils are electrically connected to the secondary winding of the transformer by terminating ends of said first and second choke coils and ends of said transformer secondary winding to traces on said circuit board on which the connector housing is mounted, thereby eliminating the need for a circuit board internal to the connector in order to connect the secondary winding of the transformer to the two choke coils.

5. A connector as claimed in claim 4, wherein one of end of each of the choke coils is shaped to form mating sections of a pair of RJ contacts.

6. A connector as claimed in claim 4, further comprising a second transformer and third and fourth choke coils.

* * * * *